(12) United States Patent
Wang et al.

(10) Patent No.: US 12,527,091 B2
(45) Date of Patent: Jan. 13, 2026

(54) SUBSTRATE INTEGRATED WITH PASSIVE DEVICE AND METHOD FOR MANUFACTURING THE SAME

(71) Applicant: BOE TECHNOLOGY GROUP CO., LTD., Beijing (CN)

(72) Inventors: Xiyuan Wang, Beijing (CN); Feng Qu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 671 days.

(21) Appl. No.: 17/800,166

(22) PCT Filed: Oct. 28, 2021

(86) PCT No.: PCT/CN2021/127071
§ 371 (c)(1),
(2) Date: Aug. 16, 2022

(87) PCT Pub. No.: WO2022/134847
PCT Pub. Date: Jun. 30, 2022

(65) Prior Publication Data
US 2023/0070790 A1 Mar. 9, 2023

(30) Foreign Application Priority Data
Dec. 25, 2020 (CN) .......................... 202011560442.3

(51) Int. Cl.
*H10D 86/85* (2025.01)
*H01L 21/70* (2006.01)
(Continued)

(52) U.S. Cl.
CPC ........... *H10D 86/85* (2025.01); *H01L 21/707* (2013.01); *H10D 1/20* (2025.01); *H10D 1/47* (2025.01); *H10D 1/692* (2025.01)

(58) Field of Classification Search
CPC .......... H10D 86/85; H10D 1/692; H10D 1/20; H10D 1/47; H01L 21/707
See application file for complete search history.

(56) References Cited

U.S. PATENT DOCUMENTS

| 7,790,503 B2 * | 9/2010 | Lin ...................... H01L 21/6835 438/107 |
| 2008/0173976 A1 * | 7/2008 | Stamper ................. H10D 88/00 257/E21.022 |
| 2010/0065942 A1 | 3/2010 | Lin et al. |

FOREIGN PATENT DOCUMENTS

| CN | 101388274 A | 3/2009 |
| CN | 102065636 A | 5/2011 |

(Continued)

OTHER PUBLICATIONS

Machine translation of CN111769096 (Year: 2025).*
(Continued)

*Primary Examiner* — Richard A Booth
(74) *Attorney, Agent, or Firm* — HOUTTEMAN LAW LLC

(57) ABSTRACT

The present disclosure provides a substrate integrated with a passive device and a method for manufacturing the same, and belongs to the technical field of communications. The substrate integrated with a passive device according to the present disclosure includes a dielectric layer provided with a first connection via; and the passive device at least including an inductor. The inductor includes a plurality of first sub-structures and a plurality of second sub-structures respectively disposed on two opposite sides of the dielectric layer, and two adjacent first sub-structures of the plurality of first sub-structures are short-circuited by a corresponding one of the plurality of second sub-structures through the first (Continued)

connection via penetrating through the dielectric layer, so as to form an induction coil of the inductor.

18 Claims, 4 Drawing Sheets

(51) Int. Cl.
  *H10D 1/20* (2025.01)
  *H10D 1/47* (2025.01)
  *H10D 1/68* (2025.01)

(56) References Cited

FOREIGN PATENT DOCUMENTS

| | | |
|---|---|---|
| CN | 203386743 U | 1/2014 |
| CN | 104682910 A | 6/2015 |
| CN | 105957691 A | 9/2016 |
| CN | 106604544 A | 4/2017 |
| CN | 206282838 U | 6/2017 |
| CN | 111345121 A | 6/2020 |
| CN | 111769096 A | 10/2020 |
| CN | 111834341 A | 10/2020 |
| CN | 214672615 U | 11/2021 |

OTHER PUBLICATIONS

China Patent Office, First Office Action, issued May 15, 2024, Appl'n. CN202011560442.3.
China Patent Office, Fourth Office Action, Nov. 19, 2025, for corresponding CN application No. 202011560442.3.

\* cited by examiner

SUBSTRATE INTEGRATED WITH PASSIVE DEVICE AND METHOD FOR MANUFACTURING THE SAME

TECHNICAL FIELD

The present disclosure belongs to the technical field of communications, and particularly relates to a substrate integrated with a passive device and a method for manufacturing the substrate.

BACKGROUND

Nowadays, consumer electronics industry is developing rapidly, so are mobile communication terminals represented by mobile phones, especially 5G mobile phones. Frequency bands of signals to be processed by the mobile phones have become more and more, resulting in an increase in the number of required radio frequency chips, but the mobile phones which are popular among consumers are continuously developing towards miniaturization, lightness, thinness and long battery life. In a traditional mobile phone, a large number of discrete devices such as resistors, capacitors, inductors and filters are provided on a radio frequency Printed Circuit Board (PCB), and those discrete devices can hardly meet future requirements due to their disadvantages such as a large volume, high power consumption, many solder joints and large variation of parasitic parameters. Interconnection and matching between the radio frequency chips require integrated passive devices with a small area, high performance and good consistency. The integrated passive devices currently on the market are mainly based on silicon (Si) substrates and gallium arsenide (GaAs) substrates. The Si-based integrated passive devices are cheap, but have relatively high microwave loss and common performance because Si contains a trace of impurities (which cause poor insulation); while the GaAs-based integrated passive devices have good performance, but are expensive.

SUMMARY

The present disclosure aims to solve at least one of the technical problems in the prior art, and provides a substrate integrated with a passive device and a method for manufacturing the same.

An embodiment of the present disclosure provides a substrate integrated with a passive device, including: a dielectric layer provided with a first connection via; and the passive device at least including an inductor. The inductor includes a plurality of first sub-structures and a plurality of second sub-structures respectively disposed on two opposite sides of the dielectric layer, and two adjacent first sub-structures of the plurality of first sub-structures are short-circuited by a corresponding one of the plurality of second sub-structures through the first connection via penetrating through the dielectric layer, so as to form an induction coil of the inductor.

The dielectric layer includes a glass substrate; and the first via penetrates through the glass substrate; and the glass substrate has a first surface and a second surface opposite to each other; and the plurality of first sub-structures are disposed on the first surface, and the plurality of second sub-structures are disposed on the second surface.

The substrate further includes a first protective layer on a side of the plurality of first sub-structures away from the glass substrate.

The glass substrate has a thickness ranging from 0.3 mm to 1.1 mm.

The substrate further includes a base substrate. The plurality of first sub-structures are disposed on a side of the dielectric layer proximal to the base substrate, and the plurality of second sub-structures are disposed on a side of the dielectric layer away from the base substrate.

The base substrate includes a glass substrate.

The dielectric layer includes a first inorganic insulating layer and a first organic insulating layer sequentially disposed on a side away from the base substrate; and the first connection via penetrates the first inorganic insulating layer and the first organic insulating layer.

A connecting portion is inside the first connection via, and two adjacent first sub-structures of the plurality of first sub-structures are short-circuited by a corresponding one of the plurality of second sub-structures through the connecting portion inside the first connection via.

The induction coil includes a first signal terminal and a second signal terminal. The substrate further includes a first interlayer dielectric layer on a side of the plurality of second sub-structures away from the glass substrate, and a first pad and a second pad on a side of the first interlayer dielectric layer away from the dielectric layer. The first pad is electrically connected to the first signal terminal of the induction coil through a second connection via penetrating through the first interlayer dielectric layer; and the second connection pad is electrically connected to the second signal terminal of the induction coil through a third connection via penetrating through the first interlayer dielectric layer.

The passive device further includes a resistor and/or a capacitor.

The passive device includes the resistor, and the resistor is in a same layer as the plurality of first sub-structures or the plurality of second sub-structures.

The passive device includes the capacitor, a first electrode plate of the capacitor is in a same layer as the plurality of first sub-structures, and a second electrode plate of the capacitor is in a same layer as the plurality of second sub-structures; or the first electrode plate of the capacitor is in a same layer as the plurality of second sub-structures, and the second electrode plate of the capacitor is on a side of the first electrode plate away from the dielectric layer.

An embodiment of the present application provides a method for manufacturing a substrate integrated with a passive device, including: providing a dielectric layer, and forming a first connection via penetrating through the dielectric layer; integrating the passive device on the dielectric layer; wherein the passive device at least includes an inductor including a plurality of first sub-structures and a plurality of second sub-structures respectively on two opposite sides of the dielectric layer, and two adjacent first sub-structures of the plurality of first sub-structures are short-circuited by a corresponding one of the plurality of second sub-structures through the first connection via penetrating through a glass substrate, so as to form an induction coil of the inductor.

The dielectric layer includes a glass substrate having a first surface and a second surface opposite to each other; and integrating the passive device on the dielectric layer includes: forming the first connection via penetrating through the glass substrate by means of laser drilling; and forming the plurality of first sub-structures of the inductor on the first surface of the glass substrate, and forming the plurality of second sub-structures of the inductor on the second surface of the glass substrate, such that two adjacent first sub-structures of the plurality of first sub-structures are short-circuited by a corresponding one of the plurality of second sub-structures through the first connection via.

Forming the plurality of first sub-structures of the inductor on the first surface of the glass substrate and forming the plurality of second sub-structures of the inductor on the second surface of the glass substrate includes: forming electroplating seed layers on the first surface and the second surface of the glass substrate and on an inner wall of the first connection via, respectively; forming metal layers on the first surface and the second surface by an electroplating process respectively, and forming a connecting portion on the inner wall of the first connection via by the electroplating process; and respectively patterning the metal layers on the first surface and the second surface to form the plurality of first sub-structures and the plurality of second sub-structures, such that two adjacent first sub-structures of the plurality of first sub-structures are short-circuited by a corresponding one of the plurality of second sub-structures through the connecting portion inside the first connection via.

Forming the electroplating seed layers on the first surface and the second surface of the glass substrate and on the inner wall of the first connection via respectively includes: first forming auxiliary metal films on the first surface and the second surface of the glass substrate and on the inner wall of the first connection via respectively, and then forming first metal films to form the electroplating seed layers.

The substrate includes a base substrate. Integrating the passive device on the dielectric layer includes: forming a pattern comprising the plurality of first sub-structures of the inductor on the base substrate by a patterning process; forming the dielectric layer, and forming the first connection via penetrating through the dielectric layer; and forming the plurality of second sub-structures of the inductor, such that two adjacent first sub-structures of the plurality of first sub-structures are short-circuited by one of the plurality of second sub-structures through the first connection via.

The dielectric layer includes a first inorganic insulating layer and a first organic insulating layer sequentially on a side of the grass substrate. Forming the dielectric layer and forming the first connection via penetrating through the dielectric layer includes: forming the first inorganic insulating layer, and forming a first sub-via penetrating through the first inorganic insulating layer by a patterning process; and forming the first organic insulating layer, and forming a second sub-via penetrating through the first organic insulating layer by a patterning process, such that an orthographic projection of the second sub-via on the glass substrate at least partially overlaps an orthographic projection of the first sub-via on the glass substrate, so as to form the first connection via.

Forming the plurality of second sub-structures of the inductor includes: forming electroplating seed layers on a surface of the dielectric layer away from the glass substrate and on an inner wall of the first connection via; forming a metal layer on the surface of the dielectric layer away from the base substrate by an electroplating process, and forming a connecting portion on the inner wall of the first connection via by the electroplating process; and patterning the metal layer to form the plurality of second sub-structures, such that two adjacent first sub-structures of the plurality of first sub-structures are short-circuited by a corresponding one of the plurality of second sub-structures through the connecting portion inside the first connection via.

The method further includes: forming a first interlayer dielectric layer on a side of the plurality of second sub-structures of the inductor away from the glass substrate; and forming a second connection via and a third connection via penetrating through the first interlayer dielectric layer; and forming a pattern comprising a first pad and a second pad by a patterning process, such that the first pad is electrically connected to a first signal terminal of the induction coil through the second connection via, and the second pad is electrically connected to a second signal terminal of the induction coil through the third connection via.

DETAIL DESCRIPTION OF EMBODIMENTS

Figure 1:
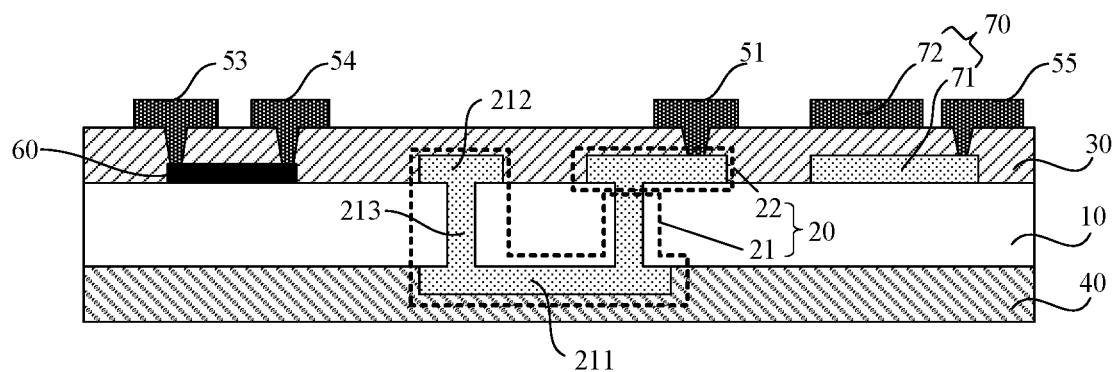
FIG. 1 is a schematic diagram showing a substrate integrated with a passive device according to an embodiment of the present disclosure.

In order to enable those of ordinary skill in the art to better understand the technical solutions of the present disclosure, the present disclosure is further described in detail below with reference to the accompanying drawings and specific implementations.

Unless otherwise defined, technical terms or scientific terms used herein should have general meanings that are understood by those of ordinary skill in the technical field to which the present disclosure belongs. The words "first", "second" and the like used herein do not denote any order, quantity or importance, but are just used to distinguish between different elements. Similarly, the words "one", "a", "the" and the like do not denote a limitation to quantity, and indicate the existence of "at least one" instead. The words "include", "comprise" and the like indicate that an element or object before the words covers the elements or objects or the equivalents thereof listed after the words, rather than excluding other elements or objects. The words "connect", "couple" and the like are not limited to physical or mechanical connection, but may also indicate electrical connection, whether direct or indirect. The words "on", "under", "left", "right" and the like are only used to indicate relative positional relationships. When an absolute position of an object described is changed, the relative positional relationships may be changed accordingly.

An embodiment of the present disclosure provides a substrate integrated with a passive device, including a dielectric layer, and a passive device integrated on a base substrate. The passive device at least includes an inductor. The inductor generally includes an induction coil, and a first lead terminal and a second lead terminal which are connected to a first signal terminal and a second signal terminal of the induction coil respectively. In the embodiment of the present disclosure, the induction coil at least includes first sub-structures and second sub-structures, which are respectively disposed on two opposite sides of the dielectric layer, and two adjacent first sub-structures are short-circuited by one second sub-structure through a first connection vias penetrating through the dielectric layer, so as to form the induction coil of the inductor.

In some examples, the dielectric layer includes, but is not limited to, any one of a glass substrate, a flexible base, and an interlayer dielectric layer at least including an organic insulating layer.

In the embodiment of the present disclosure, a Q value of the inductor is greater than or equal to 50. In a case where the dielectric layer is the glass substrate, the inductor is integrated on the glass substrate, and the performance of the inductor is excellent when the Q value of the inductor ranges from about 80 to about 120.

Apparently, the passive device on the substrate in the embodiment of the present disclosure may not only include the inductor, but also include a resistor, a capacitor, and other devices having a function of a specific radio frequency circuit. The embodiment of the present disclosure is illustrated mainly by taking a case where the passive device includes the inductor, the resistor, and the capacitor as an example. It should be understood that the passive device is not limited to only including the inductor, the resistor, and the capacitor, and any other cases where the passive device is integrated on the dielectric layer fall within the scope of the embodiment of the present disclosure.

The substrate, which is obtained, according to the embodiment of the present disclosure, by integrating the passive device such as the inductor on the dielectric layer especially the glass substrate, has the advantages such as a small volume, light weight, high performance, and low power consumption.

In order to clarify a structure of the substrate integrated with a passive device in the embodiment of the present disclosure, the structure is respectively described below by taking a case where the dielectric layer is the glass substrate and the dielectric layer is the interlayer dielectric layer (i.e., a second interlayer dielectric layer) at least including an organic insulating layer as an example.

In an example, FIG. 1 is a schematic diagram of a substrate integrated with a passive device according to an embodiment of the present disclosure. The substrate includes a glass substrate 10 and an inductor 20, and the glass substrate 10 has a first surface and a second surface which are opposite to each other; and the inductor 20 includes first sub-structures 211 and second sub-structures 212. The first sub-structures 211 are disposed on the first surface of the glass substrate 10, and the second sub-structures 212 are disposed on the second surface of the glass substrate 10; and a plurality of first connection vias 11 are provided in the glass substrate 10, and one second sub-structure 212 electrically connects two adjacent first sub-structures 211 to each other through the first connection vias 11 in the glass substrate 10, so as to form an induction coil 21.

Figure 2:
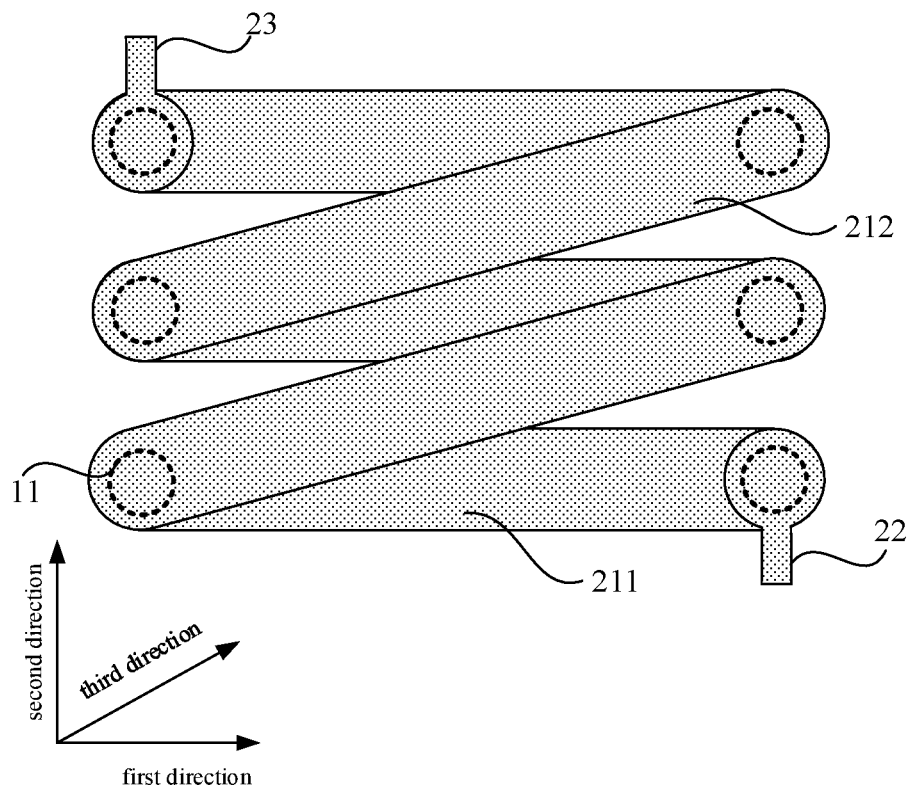
FIG. 2 is a top view showing an inductor according to an embodiment of the present disclosure.

For example, FIG. 2 is a top view showing the inductor 20 according to the embodiment of the present disclosure. With reference to FIG. 2, all of the first sub-structures 211 of the inductor 20 extend along a first direction and are arranged side by side along a second direction; and all of the second sub-structures 212 of the inductor 20 extend along a third direction and are arranged side by side along the second direction. The first direction, the second direction and the third direction are different from one another. A case where the first direction and the second direction are perpendicular to each other, and the first direction and the third direction intersect but are not perpendicular to each other is taken as an example in the embodiment of the present disclosure. Apparently, the direction along which the first sub-structures 211 extend and the direction along which the second sub-structures 212 extend may be interchanged, which also falls within the scope of the embodiment of the present disclosure. In addition, the embodiment of the present disclosure is illustrated by taking a case where the inductor 20 includes N first sub-structures 211 and (N−1) second sub-structures 212 as an example, where N is an integer greater than or equal to 2. An orthographic projection of each of a first end and a second end of each of the first sub-structures 211 on the glass substrate 10 at least partially overlaps an orthographic projection of a corresponding one of the first connection vias 11 on the glass substrate 10. The first end and the second end of each of the first sub-structures 211 correspond to different first connection vias 11, that is, an orthographic projection of each of the first sub-structures 211 on the glass substrate 10 at least partially overlaps orthographic projections of two corresponding ones of the first connection vias 11 on the glass substrate 10. In such case, the first end of an $i^{th}$ one of the second sub-structures 212 of the inductor 20 is connected to the first end of an $i^{th}$ one of the first sub-structures 211 and the second end of an $(i+1)^{th}$ one of the first sub-structures 211 to form the induction coil 21, where $1 \le i \le N-1$, and i is an integer.

It should be noted that the induction coil 21 has a first signal terminal and a second signal terminal. The second end of the first one of the first sub-structures 211 may serve as the first signal terminal of the induction coil 21, and the first end of the $N^{th}$ one of the first sub-structures 211 may serve as the second signal terminal of the induction coil 21. In some examples, in order to facilitate connection between the inductor 20 and other devices, the inductor 20 not only includes the induction coil 21, but includes a first lead terminal 22 and a second lead terminal 23. The first lead terminal 22 is connected to the first signal terminal of the induction coil 21, that is, connected to the second end of the first one of the first sub-structures 211, and the second lead terminal 23 is connected to the second signal terminal of the induction coil 21, that is, connected to the first end of the $N^{th}$ one of the first sub-structures 211. Further, the first lead terminal 22, the second lead terminal 23 may be disposed in the same layer and made of the same material as the second sub-structures 212, in such case, the first lead terminal 22 may be connected to the second end of the first one of the first sub-structures 211 through a first connection via 11, and correspondingly, the second lead terminal 23 may be connected to the first end of the $N^{th}$ one of the first sub-structures 211 through a first connection via 11.

In some examples, connecting portions 213 are formed inside the first connection vias 11 and configured to short-circuit the first sub-structures 211 and the second sub-structures 212 corresponding to the first sub-structures 211. The connecting portions 213 may be formed on inner walls of the first connection vias 11, or may fill up the entire first connection vias 11, as long as it may be ensured that the first sub-structures 211 are electrically connected to the corresponding second sub-structures 212.

Still with reference to FIG. 1, a first interlayer dielectric layer 30 is disposed on a side of the second sub-structures 212 of the inductor 20 away from the glass substrate 10, and a first pad 51 and a third pad 53 are disposed on a side of the first interlayer dielectric layer 30 away from the glass substrate 10. A second connection via 12 and a third connection via are disposed in the first interlayer dielectric layer 30. The first pad 51 is electrically connected to the first signal terminal of the induction coil 21 through the second connection via 12, and the third pad 53 is electrically connected to the second signal terminal of the induction coil 21 through the third connection via. The first pad 51 and the third pad 53 are configured to electrically connect the inductor 20 to a radio frequency circuit. For example, the inductor 20 is bonded to a PCB through the first pad 51 and the third pad 53, or the inductor 20 is electrically connected to the PCB by means of soldering.

For example, when the inductor 20 has the first lead terminal 22 and the second lead terminal 23, the first pad 51 may be connected to the second end of the first one of the first sub-structures 211 through the first lead terminal 22, so as to realize that the first pad is electrically connected to the first signal terminal of the induction coil 21, and the third pad 53 may be connected to the first end of the $N^{th}$ one of the first sub-structures 211 through the second lead terminal 23, so as to realize that the third pad 53 is electrically connected to the second signal terminal of the induction coil 21.

In some examples, a first protective layer 40 is provided on a side of the first sub-structures 211 of the inductor 20 away from the glass substrate 10 to prevent the first sub-structure 211 from being oxidized due to exposure. A material of the first protective layer 40 is an inorganic insulating material. For example, the first protective layer 40 is an inorganic insulating layer made of silicon nitride ($SiN_x$), or an inorganic insulating layer made of silicon dioxide ($SiO_2$), or a composite stacked layer formed by stacking the $SiN_x$ inorganic insulating layer and the $SiO_2$ inorganic insulating layer.

In some examples, still with reference to FIG. 1, in addition to including the inductor 20, the substrate further includes a resistor 60, a capacitor 70, etc. In some examples, the resistor 60 may be disposed on the second surface of the glass substrate 10, and may be made of a high-resistance material, such as tin oxide (ITO) and nickel-chromium (NiCr) alloy. In some examples, a first electrode plate 71 of the capacitor 70 may be disposed in the same layer as the second sub-structures 212 of the inductor 20, and a second electrode plate 72 of the capacitor 70 may be disposed in the same layer as the first pad 51 and the third pad 53, which facilitates fabrication without increasing the number of steps of manufacture.

In addition, in the embodiment of the present disclosure, a third pad, a fourth pad 54, a fifth pad 55, and a sixth pad 56 may be further disposed in the same layer as the first pad 51 and the third pad 53. The third pad is connected to a first terminal of the resistor 60 through a fourth connection via penetrating through the first interlayer dielectric layer 30, the fourth pad 54 is connected to a second terminal of the resistor 60 through a fifth connection via penetrating through the first interlayer dielectric layer 30, the fifth pad 55 is connected to the first electrode plate 71 of the capacitor 70 through a sixth connection via penetrating through the first interlayer dielectric layer 30, and the sixth pad 56 and the second electrode plate 72 of the capacitor 70 may be formed as a one-piece structure. The third pad and the fourth pad 54 are configured to connect the resistor 60 to the radio frequency circuit, and the fifth pad 55 and the sixth pad 56 are configured to connect the capacitor 70 to the radio frequency circuit. It should be understood that, the capacitor 70 and the resistor 60 may be electrically connected to the devices on the substrate without using the pads. In order to clarify the specific structure of the substrate integrated with a passive device and parameters of each layer such as a material and a thickness of each layer of the substrate in the embodiment of the present disclosure, a method for manufacturing the substrate is described below. The method is described by taking a case where the substrate is integrated thereon with three devices, i.e. the inductor 20, the resistor 60, and the capacitor 70, as an example. It should be understood that any case where the substrate is integrated thereon with the inductor 20 falls within the scope of the embodiment of the present disclosure.

An embodiment of the present disclosure provides a method for manufacturing a substrate integrated with a passive device, which specifically includes the following steps one to five.

Figure 3:
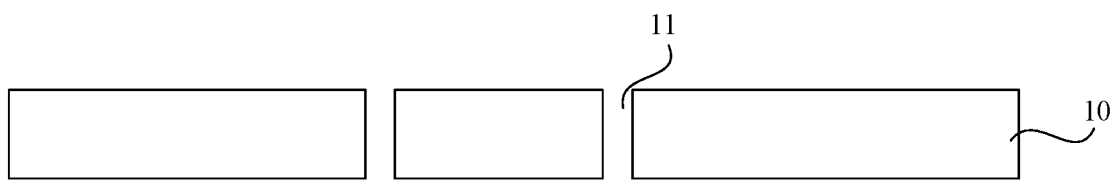
FIG. 3 is a schematic diagram showing a structure formed in step one of a method for manufacturing a substrate integrated with a passive device according to an embodiment of the present disclosure.

In step one, the glass substrate 10 is provided; and a plurality of the first connection vias 11 penetrating through the glass substrate 10 are formed, as shown in FIG. 3. The first connection vias 11 correspond to the ends of the to-be-formed first sub-structures 211 of the induction coil 21. Specifically, each of the first sub-structures 211 is provided with the first end and the second end which are opposite to each other. In such case, one of two first connection vias 11 arranged side by side along the first direction corresponds to the first end of one of the to-be-formed first sub-structures 211, and the other of the two first connection vias 11 corresponds to the second end of the to-be-formed first sub-structure 211.

In some examples, step one may specifically include the following steps (1) to (3).

Step (1) Cleaning: the glass substrate 10 is cleaned by a cleaning machine.

In some examples, the glass substrate 10 has a thickness ranging from about 0.1 mm to about 1.1 mm.

Step (2) Laser drilling: a laser irradiates a laser beam vertically into a surface of the glass substrate 10 to form the plurality of first connection vias 11 in the glass substrate 10. Specifically, when the laser beam interacts with the glass substrate 10, atoms in the glass substrate 10 are ionized and ejected out of the surface of the glass substrate 10 due to relatively high energy of laser photons, so that the drilled holes become deeper and deeper with time until the whole glass substrate 10 is penetrated, that is, the plurality of first connection vias 11 are formed. In general, laser wavelengths of 532 nm, 355 nm, 266 nm, 248 nm, and 197 nm may be selected, laser pulse widths ranging from 1 fs to 100 fs, from 1 ps to 100 ps, and from 1 ns to 100 ns may be selected, and the laser may be a continuous wave laser, a pulse laser or the like. The laser drilling may be carried out in the following two ways, but is not limited to the two ways. In the first way, a diameter of a laser spot is relatively large, relative positions of the laser beam and the glass substrate 10 are fixed, and the glass substrate 10 is directly penetrated due to high energy of the laser beam, in such case, each first connection via 11 formed is in a shape of inverted frustum, and a diameter of the inverted frustum sequentially decreases from top to bottom (i.e., along a direction from the second surface towards the first surface). In the second way, the diameter of the laser spot is relatively small, the laser beam scans the glass substrate 10 in a manner of drawing circles, a focus of the laser spot is continuously changed, a focal depth of the focus is also continuously changed, and the laser beam scans the glass substrate 10 in a manner of a spiral line from a lower surface (i.e., the first surface) of the glass substrate 10 towards an upper surface (i.e., the second surface) of the glass substrate 10, with a radius of the spiral line sequentially decreasing from bottom to top, so that part of the glass substrate 10 is cut by the laser beam into a shape of frustum, and falls off the glass substrate 10 due to gravity, thereby forming the first connection via in a shape of frustum.

In some examples, the first connection vias 11 such formed has an aperture ranging from about 10 μm to about 1 mm.

Step (3) Hydrofluoric acid (HF) etching: during the process of drilling the hole by the laser, a stress area, ranging about 5 μm to about 20 μm, may be formed in a region of an upper surface of the inner wall of the first connection via 10 proximal to the drilled hole, the surface of the stress area in the glass substrate 10 is uneven and molten, and has a plurality of burrs and a large number of microcracks and macrocracks, and residual stress exist in the stress area too. In such case, wet etching is carried out at a proper temperature for a certain time by using an HF etching solution with a concentration ranging from 2% to 20% to remove the glass in the stress area, so as to smoothen the region inside the first connection via 11 proximal to the drilled hole and the region of the surface of the first connection via 11 proximal to the drilled hole, eliminate the microcracks and the macrocracks, and remove the entire stress area.

Figure 4:
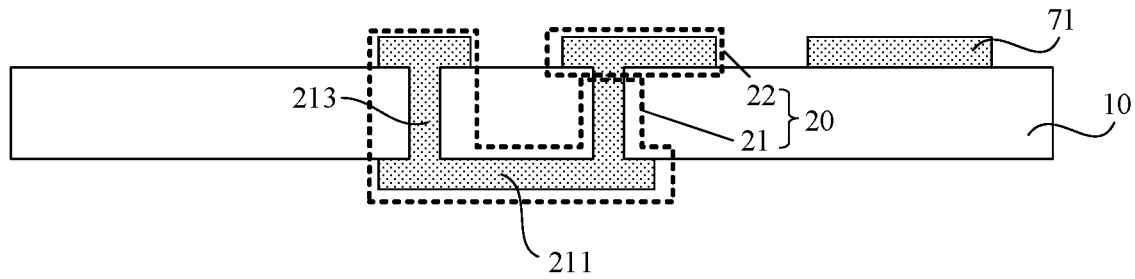
FIG. 4 is a schematic diagram showing a structure formed in step two of the method for manufacturing a substrate integrated with a passive device according to an embodiment of the present disclosure.
Figure 5:
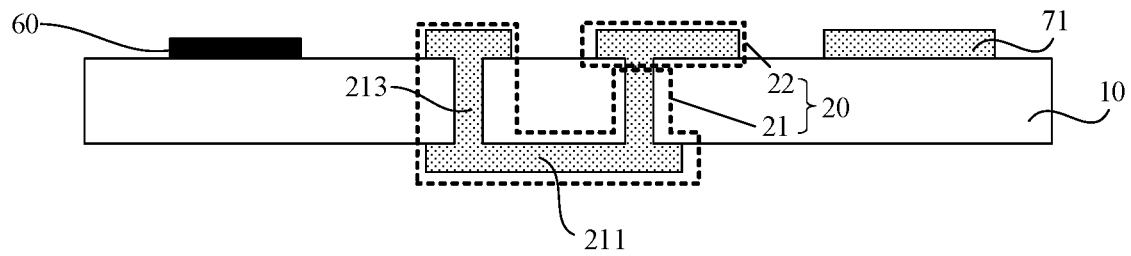
FIG. 5 is a schematic diagram showing a structure formed in step three of the method for manufacturing a substrate integrated with a passive device according to an embodiment of the present disclosure.

In step two, the first sub-structures 211 of the induction coil 21 are formed on the first surface of the glass substrate 10 obtained after step one; the second sub-structures 212 of the induction coil 21 are formed on the second surface of the glass substrate 10 obtained after step one; and the connecting portions 213, which are configured to short-circuit the first sub-structures 211 and the second sub-structures 212 to form the induction coil 21, are formed inside the first connection vias 11, as shown in FIG. 4. Apparently, the first electrode plate 71 of the capacitor 70 may also be formed on the second surface of the glass substrate 10 in this step.

In some examples, step two may specifically include the following steps (1) to (4).

Step (1) Growing of a seed layer: a first metal film as an electroplating seed layer is deposited on the first surface of the glass substrate 10 by means of magnetron sputtering. In the processing of depositing the first metal film, the first metal film is also deposited on the inner walls of the first connection vias 11. Then the glass substrate 10 is turned over. Similarly, another first metal film, which serves as an electroplating seed layer, is deposited on the second surface of the glass substrate 10 by means of magnetron sputtering.

In some examples, a material of the first metal films includes, but is not limited to, copper (Cu), and a thickness of the first metal films ranges from about 100 nm to about 500 nm, and may specifically range from 50 nm to 35 μm. In the following description, a case where the material of the first metal films is Cu is taken as an example.

In some examples, in order to increase adhesion between the first metal films and the glass substrate 10, before the first metal films are deposited, an auxiliary metal film may be formed on each of the first surface and the second surface of the glass substrate 10 in a manner including, but not limited to, magnetron sputtering. A material of the auxiliary metal film includes, but is not limited to, nickel (Ni), and a thickness of the auxiliary metal film ranges from about 2 nm to about 20 nm.

Step (2) Hole-filling by electroplating: the glass substrate 10 is placed on a carrier of an electroplating machine, pressed by a powered pad, and placed in a hole-filling electroplating bath which contains a dedicated hole-filling electrolyte, a current is applied to keep an electroplating solution to flow over the surfaces of the glass substrate 10 continuously and rapidly, and cations in the electroplating solution near the inner walls of the first connection vias 11 acquire electrons to form atoms which are deposited on the inner walls; and by using the dedicated hole-filling electrolyte with special proportion, copper may be mainly deposited in the first connection vias at a high speed (with a deposition speed ranging from 0.5 μm/min to 3 μm/min), while copper may be deposited on the first surface and the second surface of the glass substrate 10 which are relatively flat at an extremely low speed (with a deposition speed ranging from 0.005 μm/min to 0.05 μm/min). The copper on the inner walls of the first connection vias 11 becomes more and more thicker with time, and may even fill up the first connection vias 11, thus forming the connecting portions 213 of the induction coil 21 (that is, the formation of a spiral area of the inductor 20 finished), and finally the glass substrate 10 is taken out and cleaned with deionized water.

Step (3) Patterning of metal on the first surface: the glass substrate 10 is turned over (with the first surface facing upwards), the copper layer on the first surface is coated with a photoresist, exposed, developed, and subjected to copper wet etching, and the photoresist is stripped off after the copper wet etching, thus the patterning of the metal on the first surface is finished, at this time the first sub-structures 211 of the induction coil 21 are formed on the first surface.

Step (4) Patterning of metal on the second surface: the glass substrate 10 is turned over (with the second surface facing upwards), the copper layer on the second surface is coated with a photoresist, exposed, developed, and subjected to copper wet etching, and the photoresist is stripped off after the copper wet etching, thus the patterning of the metal on the second surface is finished, at this time the second sub-structures 212 of the induction coil 21 and the first electrode plate 71 of the capacitor 70 are formed on the second surface.

Figure 6:
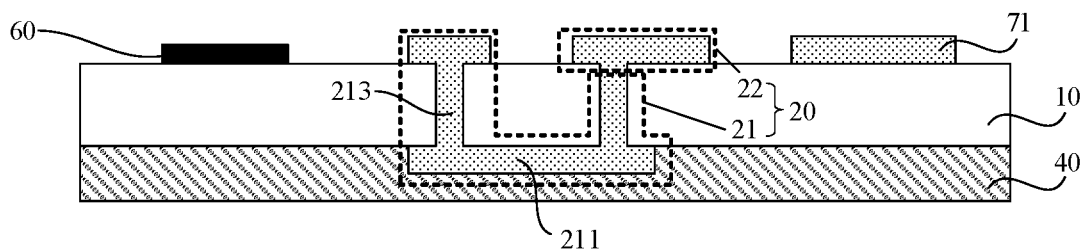
FIG. 6 is a schematic diagram showing a structure formed in step three of the method for manufacturing a substrate integrated with a passive device according to an embodiment of the present disclosure.

In some examples, after step (3) of patterning of metal on the first surface in step two and before step (4) of patterning of metal on the second surface in step two, the method further includes: forming the first protective layer 40 on the first surface of the glass substrate 10 on which the first sub-structures 211 of the induction coil 21 are formed, so as to prevent the first sub-structures 211 from being oxidized due to exposure, as shown in FIG. 6. A material of the first protective layer 40 is an inorganic insulating material. For example, the first protective layer 40 is an inorganic insulating layer made of silicon nitride ($SiN_x$) or silicon dioxide ($SiO_2$), or a composite stacked layer formed by stacking the $SiN_x$ inorganic insulating layer and the $SiO_2$ inorganic insulating layer.

In step three, the resistor 60 is formed on the glass substrate 10 obtained after step two, as shown in FIG. 6.

In some examples, step three may specifically include: depositing a high-resistivity layer of a high-resistance material such as ITO or the NiCr alloy by means of magnetron sputtering; coating with a photoresist; exposing; developing; performing wet etching; and then stripping off the photoresist, thus the formation of the resistor 60 is finished. The magnitude of the resistance value of the resistor 60 may be determined by adjusting a length, width, and thickness of the resistor 60.

In some examples, the layer of the high-resistance material has a thickness ranging from about 10 nm to about 1 μm, and the resistance value of the resistor 60 ranges from about 1 kΩ to about 100 MΩ.

Figure 7:
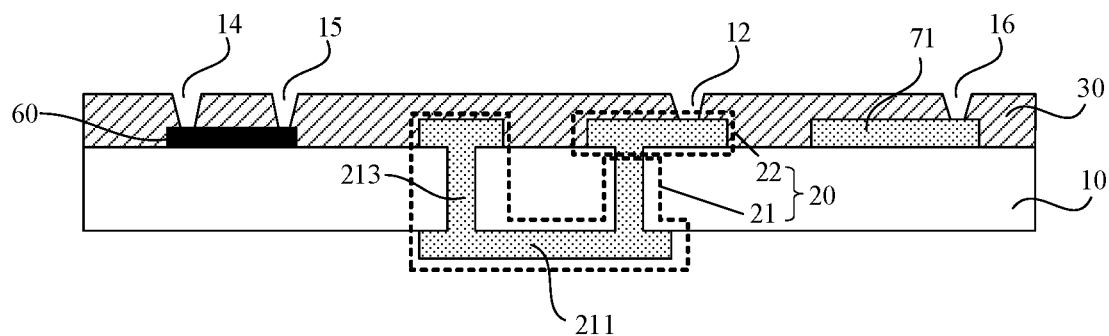
FIG. 7 is a schematic diagram showing a structure formed in step fourth of the method for manufacturing a substrate integrated with a passive device according to an embodiment of the present disclosure.

In step four, the first interlayer dielectric layer 30 is formed on the glass substrate 10 obtained after step three, and the second connection via 12, the third connection via, the fourth connection via, the fifth connection via and the sixth connection via, which penetrate through the first interlayer dielectric layer 30, are formed, as shown in FIG. 7. The second connection via 12 is configured to electrically connect the first signal terminal of the induction coil 21 to the first pad 51 to be formed, the third connection via is configured to electrically connect the second signal terminal of the induction coil 21 to the third pad 53 to be formed, the fourth connection via is configured to electrically connect the first terminal of the resistor 60 to the third pad to be formed, the fifth connection via is configured to electrically connect the second terminal of the resistor 60 to the fourth pad 54 to be formed, and the sixth connection via is configured to electrically connect the first electrode plate 71 of the capacitor 70 to the fifth pad 55 to be formed.

In some examples, step four may specifically include: first forming, by means of Plasma Enhanced Chemical Vapor Deposition (PECVD), the first interlayer dielectric layer 30 on the second surface of the glass substrate 10 on which the resistor 60, the second sub-structures of the induction coil 21 and the electrode plate of the capacitor 70 are formed, with the first interlayer dielectric layer 30 made of an inorganic insulating material. For example, the first interlayer dielectric layer 30 is an inorganic insulating layer made of silicon nitride ($SiN_x$) or silicon dioxide ($SiO_2$), or a composite stacked layer formed by stacking the $SiN_x$ inorganic insulating layer and the $SiO_2$ inorganic insulating layer. Apparently, the first interlayer dielectric layer 30 also serves as an interlayer dielectric layer of the capacitor 70. Step four may further include coating the first interlayer dielectric layer 30 with a photoresist, performing exposure, development, dry etching processes on the first interlayer dielectric layer 30, and stripping off the photoresist after the dry etching, so as to obtain the second connection via 12, the third connection via, the fourth connection via, the fifth connection via and the sixth connection via.

In some examples, the first interlayer dielectric layer 30 has a thickness ranging from about 100 nm to about 10 μm.

In step five, a pattern including the first pad 51, the third pad 53, the fourth pad 54, the fifth pad 55, the sixth pad 56, and a second electrode plate 72 of the capacitor 70 is formed by a patterning process on the glass substrate 10 obtained after step four, as shown in FIG. 1. The second electrode plate 72 of the capacitor 70 and the sixth pad 56 may be formed as a one-piece structure. The first pad 51 is electrically connected to the first signal terminal of the induction coil 21 through the second connection via 12 and a connecting portion 213 in a first connection via 11, the third pad 53 is electrically connected to the second signal terminal of the induction coil 21 through the third connection via and a connecting portion 213 in a first connection via 11, the third pad is electrically connected to the first terminal of the resistor 60 through the fourth connection via, the fourth pad 54 is electrically connected to the second terminal of the resistor 60 through the fifth connection via, and the fifth pad 55 is electrically connected to the first electrode plate 71 of the capacitor 70 through the sixth connection via.

In some examples, step five may specifically include depositing a second metal film by means of magnetron sputtering, coating on the second metal film with a photoresist, performing exposure, development and wet etching processes on the second metal film, and stripping off the photoresist after the wet etching, so as to form the pattern including the first pad 51, the third pad 53, the third-pad, the fourth pad 54, the fifth pad 55, the sixth pad 56, and the second electrode plate 72 of the capacitor 70.

In some examples, the second metal film has a thickness ranging from about 50 nm to about 35 μm.

Thus, the manufacture of the capacitor 70 and the inductor 20 is completed. The capacitance value of the capacitor 70 is determined according to the thickness of the first interlayer dielectric layer 30, a dielectric constant of the material of the first interlayer dielectric layer 30, and facing areas of the first electrode plate 71 and the second electrode plate 72. The inductance value of the inductor 20 is determined according to the number of turns of spirals, pitches of the spirals and diameters of the spirals together.

Figure 8:
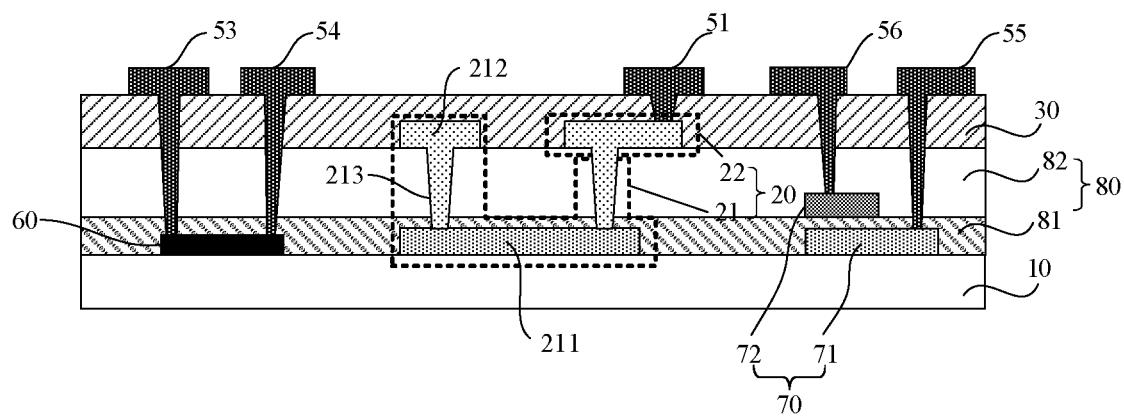
FIG. 8 is a schematic diagram showing another substrate integrated with a passive device according to an embodiment of the present disclosure.

In one example, FIG. 8 is a schematic diagram showing another substrate integrated with a passive device according to an embodiment of the present disclosure; as shown in FIG. 8, the substrate includes the glass substrate 10 and the inductor 20. The inductor 20 includes the first sub-structures 211 and the second sub-structures 212. A second interlayer dielectric layer 80 is provided between the first sub-structures 211 and the second sub-structures 212 of the inductor 20, and the plurality of first connection vias 11 are disposed in the second interlayer dielectric layer 80. A corresponding one of the second sub-structures 212 electrically connects two adjacent ones of the first sub-structures 211 to each other through the first connection vias 11 in the second interlayer dielectric layer 80, so as to form the induction coil 21.

It should be noted that the glass substrate 10 shown in FIG. 8 may be replaced with a base substrate of any material, and a case where the base substrate is the glass substrate 10 is merely taken as an example in the embodiment of the present disclosure. The arrangement of the first sub-structures 211, the second sub-structures 212 and the first connection vias 11 is the same as those shown in FIG. 2, and thus will not be repeated here.

In some examples, the second interlayer dielectric layer 80 includes a first inorganic insulating layer 81 and a first organic insulating layer 82, which are sequentially arranged along a direction away from the glass substrate 10. The first connection vias 11 penetrate through the first inorganic insulating layer 81 and the first organic insulating layer 82. In some examples, the first inorganic insulating layer 81 is an inorganic insulating layer made of silicon nitride ($SiN_x$), or an inorganic insulating layer made of silicon dioxide ($SiO_2$), or a composite stacked layer formed by stacking several $SiN_x$ inorganic insulating layers and several the $SiO_2$ inorganic insulating layers. A material of the first organic insulating layer 82 includes a photoresist, or polyimide.

For example, when the second interlayer dielectric layer 80 is a stacked structure including the first inorganic insulating layer 81 and the first organic insulating layer 82, each of the first connection vias 11 may include a first sub-via penetrating through the first inorganic insulating layer 81 and a second sub-via penetrating through the first organic insulating layer 82, with the first sub-via and the second sub-via stacked on each other.

In some examples, the connecting portion 213 is formed inside each of the first connection vias 11, and is configured to short-circuit the first sub-structures 211 and the second sub-structures 212 corresponding to the first sub-structures 211. The connecting portion 213 may be formed on the inner walls of the first connection via 11, or may fill up the entire first connection via 11, as long as it may be ensured that the first sub-structures 211 are electrically connected to the corresponding second sub-structures 212.

Still with reference to FIG. 8, the first interlayer dielectric layer 30 is disposed on a side of the second sub-structures 212 of the inductor 20 away from the glass substrate 10, and the first pad 51 and the third pad 53 are disposed on a side of the first interlayer dielectric layer 30 away from the glass substrate 10. The second connection via 12 and the third connection via are disposed in the first interlayer dielectric layer 30. The first pad 51 is electrically connected to the first signal terminal of the induction coil 21 through the second connection via 12, and the third pad 53 is electrically connected to the second signal terminal of the induction coil 21 through the third connection via. The first pad 51 and the third pad 53 are configured to electrically connect the inductor 20 to the radio frequency circuit. For example, the inductor 20 is bonded to the PCB through the first pad 51 and the third pad 53, or the inductor 20 is electrically connected to the PCB by means of soldering.

For example, when the inductor 20 has the first lead terminal 22 and the second lead terminal 23, the first pad may be connected to the second end of the first one of the first sub-structures 211 through the first lead terminal 22, so as to realize that the first pad is electrically connected to the first signal terminal of the induction coil 21; and the third pad 53 may be connected to the first end of the $N^{th}$ one of the first sub-structures 211 through the second lead terminal 23, so as to realize that the third pad 53 is electrically connected to the second signal terminal of the induction coil 21.

In some examples, still with reference to FIG. 8, in addition to including the inductor 20, the substrate is further provided with the resistor 60, the capacitor 70, etc. In some examples, when the second interlayer dielectric layer 80 includes the first inorganic insulating layer 81 and the first organic insulating layer 82, the resistor 60 may be disposed between the glass substrate 10 and the first inorganic insulating layer 81, and may be made of a high-resistance material, such as ITO or the NiCr alloy. In some examples, the first electrode plate 71 of the capacitor 70 may be disposed in the same layer as the first sub-structures 211 of the inductor 20, that is, disposed between the glass substrate 10 and the first inorganic insulating layer 81, which facilitates the fabrication without increasing the number of the process steps. The second electrode plate 72 of the capacitor 70 may be disposed between the first organic insulating layer 82 and the first inorganic insulating layer 81.

In addition, in the embodiment of the present disclosure, the third pad, the fourth pad 54, the fifth pad 55, and the sixth pad 56 may be further disposed in the same layer as the first pad 51 and the third pad 53. The third pad is connected to the first terminal of the resistor 60 through the fourth connection via penetrating through the first interlayer dielectric layer 30 and the second interlayer dielectric layer 80 (i.e., the first organic insulating layer 82 and the first inorganic insulating layer 81), the fourth pad 54 is connected to the second terminal of the resistor 60 through the fifth connection via penetrating through the first interlayer dielectric layer 30 and the second interlayer dielectric layer 80 (i.e., the first organic insulating layer 82 and the first inorganic insulating layer 81), the fifth pad 55 is connected to the first electrode plate 71 of the capacitor 70 through the sixth connection via penetrating through the first interlayer dielectric layer 30 and the second interlayer dielectric layer 80 (i.e., the first organic insulating layer 82 and the first inorganic insulating layer 81), and the sixth pad 56 is connected to the second electrode plate 72 of the capacitor 70 through the sixth connection via penetrating through the first interlayer dielectric layer 30 and the first organic insulating layer 82. The third pad and the fourth pad 54 are configured to connect the resistor 60 to the radio frequency circuit, and the fifth pad 55 and the sixth pad 56 are configured to connect the capacitor 70 to the radio frequency circuit. It should be understood that, if the capacitor 70 and the resistor 60 can be electrically connected to devices on the substrate without using the pads. In order to clarify the specific structure of the substrate integrated with a passive device, and parameters of each layer such as a material and a thickness of each layer in the embodiment of the present disclosure will be described below in conjunction with a method for manufacturing the substrate. The method will be described by taking a case where the substrate is integrated thereon with three devices, i.e. the inductor 20, the resistor 60, and the capacitor 70, as an example. It should be understood that any case where the substrate is integrated thereon with the inductor 20 falls within the scope of the embodiment of the present disclosure.

In order to clarify the specific structure of the substrate integrated with a passive device, and parameters of each layer such as a material and a thickness of each layer in the embodiment of the present disclosure will be described below in conjunction with a method for manufacturing the substrate. The method will be described by taking a case where the substrate is integrated thereon with three devices, i.e. the inductor 20, the resistor 60, and the capacitor 70, as an example. It should be understood that any case where the substrate is integrated thereon with the inductor 20 falls within the scope of the embodiment of the present disclosure.

An embodiment of the present disclosure provides a method for manufacturing a substrate integrated with a passive device, which specifically includes steps one to six.

Figure 9:
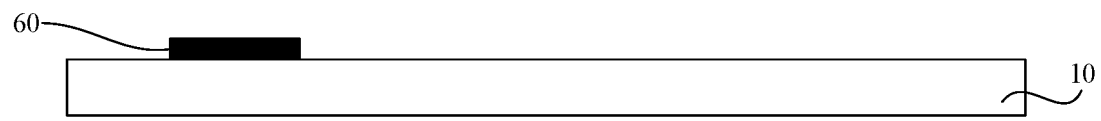
FIG. 9 is a schematic diagram showing a structure formed in step one of another method for manufacturing a substrate integrated with a passive device according to an embodiment of the present disclosure.

In step one, the glass substrate 10 is provided, and a pattern including the resistor 60 is formed on the glass substrate 10 by a patterning process, as shown in FIG. 9.

In some examples, step one may specifically include the following steps (1) and (2).

Step (1) Cleaning: the glass substrate 10 is cleaned in a cleaning machine.

Step (2) Deposition of a layer of a high-resistance material: a high-resistivity layer of a high-resistance material such as ITO or the NiCr alloy is deposited on the glass substrate 10 by means of magnetron sputtering, coating of a photoresist, exposure and development are performed on a side of the layer of the high-resistance material away from the glass substrate, then wet etching is performed, and the photoresist is stripped off after the wet etching, thus the fabrication of the resistor 60 is finished. The magnitude of the resistance value of the resistor 60 may be determined by adjusting a length, width, and thickness of the resistor 60. In some examples, the layer of the high-resistance material has a thickness ranging from about 10 nm to about 1 μm, and the resistance value of the resistor 60 ranges from about 1 kΩ to about 100 MΩ.

Figure 10:
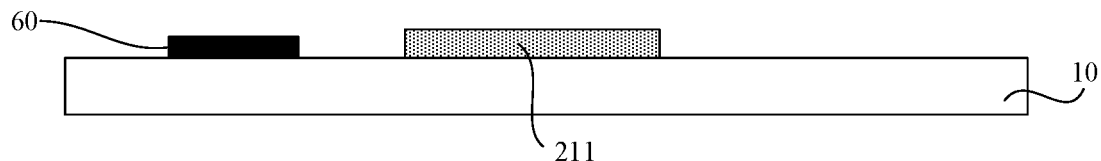
FIG. 10 is a schematic diagram showing a structure formed in step two of another method for manufacturing a substrate integrated with a passive device according to an embodiment of the present disclosure.

In step two, a pattern including the first sub-structures 211 of the induction coil 21 and the first electrode plate 71 of the capacitor 70 is formed by a patterning process on the glass substrate 10 obtained after step one, as shown in FIG. 10.

In some examples, step two may specifically include: forming, in a manner including, but not limited to, magnetron sputtering, a third metal film on the glass substrate 10 on which the resistor 60 is formed; coating on the third metal film with a photoresist; performing exposure, development and wet etching, and stripping off the photoresist after the wet etching, so as to form the pattern including the first sub-structures 211 of the induction coil 21 and the first electrode plate 71 of the capacitor 70.

Figure 11:
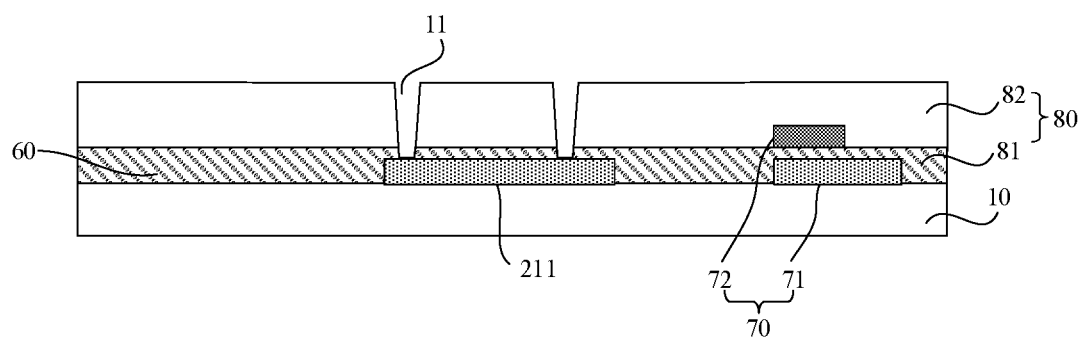
FIG. 11 is a schematic diagram showing a structure formed in step three of another method for manufacturing a substrate integrated with a passive device according to an embodiment of the present disclosure.

In step three, the second interlayer dielectric layer 80 is formed on the glass substrate 10 obtained after step two, and the first connection vias 11 penetrating through the second interlayer dielectric layer 80 are formed, as shown in FIG. 11.

In some examples, the second interlayer dielectric layer includes the first inorganic insulating layer 81 and the first organic insulating layer 82 which are sequentially arranged along a direction away from the glass substrate 10. Step three may specifically include the following steps (1) and (2).

Step (1) Firstly, the first inorganic insulating layer 81 is formed, by means of PECVD, on the second surface of the glass substrate 10 on which the resistor 60, the second sub-structures 212 of the induction coil 21, and the electrode plate of the capacitor 70 are formed, with the first inorganic insulating layer 81 made of an inorganic insulating material. For example, the first inorganic insulating layer 81 is an inorganic insulating layer made of silicon nitride ($SiN_x$), or an inorganic insulating layer made of silicon dioxide ($SiO_2$), or a composite layer formed by stacking several $SiN_x$ inorganic insulating layer and several $SiO_2$ inorganic insulating layer. Apparently, the first inorganic insulating layer 81 also serves as an interlayer dielectric layer of the capacitor 70. Then, the first inorganic insulating layer 81 is coated with a photoresist, exposed, developed, and subjected to dry etching, and the photoresist is stripped off after the dry etching, thus obtaining the first sub-vias. In some examples, the first inorganic insulating layer 81 has a thickness ranging from about 100 nm to about 10 μm.

Step (2) The first organic insulating layer 82 is formed on the glass substrate 10 by means of spin coating, spray coating, or transfer printing. Then, exposure, development and dry etching processes are performed, and the photoresist is stripped off after the dry etching, thus obtaining the second sub-vias. each of the first sub-vias and a corresponding second sub-via are stacked to form the first connection via 11. The first organic insulating layer 82 may be made of an organic insulating material such as a photoresist or polyimide. The first organic insulating layer 82 may be formed in a manner including, but not limited to, spin coating together with heat drying, or transfer printing together with thermal curing, or spray coating together with thermal curing.

In an example, if the photoresist is selected as the material of the organic insulating layer, step three may specifically include depositing a photoresist layer, and then directly performing exposure and development process on the photoresist layer, thus obtaining the second sub-vias. If polyimide is selected as the material of the organic insulating layer, step three may specifically include: depositing a polyimide layer, coating with a photoresist, performing exposure, development and dry etching processes, and stripping off the photoresist after the dry etching, thus obtaining the second sub-vias.

In some examples, a thickness of the first organic insulating layer 82 may specifically range from 29 μm to 80 μm, which is greater than a thickness of the first inorganic insulating layer 81.

In addition, step three further includes forming a patterning including the second electrode plate 72 of the capacitor 70 by a patterning process. The second electrode plate 72 of the capacitor 70 may be formed between the first inorganic insulating layer 81 and the first organic insulating layer 82.

In some examples, step of forming the second electrode plate 72 of the capacitor 70 may include depositing a fourth metal film by means of magnetron sputtering, coating the fourth metal film with a photoresist, performing exposure, development, wet etching processes on the photoresist, and stripping off the photoresist after the wet etching, so as to form the pattern including the second electrode plate 72 of the capacitor 70.

It should be noted that, in order to ensure good electrical connection between the first sub-structures 211 of the induction coil 21 and the second sub-structures 212 to be subsequently formed, an orthographic projection of each of the first sub-vias on the glass substrate 10 overlaps an entire orthographic projection of the corresponding second sub-via on the glass substrate 10.

Figure 12:
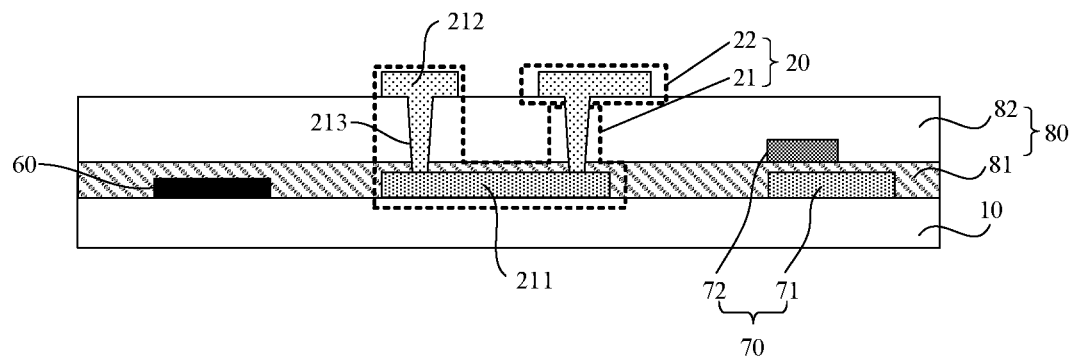
FIG. 12 is a schematic diagram showing a structure formed in step four of another method for manufacturing a substrate integrated with a passive device according to an embodiment of the present disclosure.

In step four, the second sub-structures 212 of the induction coil 21, the connecting portions 213 inside the first connection vias 11 (i.e., the first sub-vias and the second sub-vias), and the first lead terminal 22 and the second lead terminal 23 of the inductor 20 are formed on the glass substrate 10 obtained after step three, as shown in FIG. 12.

In some examples, step four may specifically include the following steps (1) to (3).

Step (1) Growing of a seed layer: a first metal film as an electroplating seed layer is deposited on the second interlayer dielectric layer 80 by means of magnetron sputtering. In the processing of depositing the first metal film, a thin layer of metal, i.e. a metal film, is deposited on the inner walls of the first connection vias 11, and the metal film also serves as the electroplating seed layer. In some examples, a material of the first metal film includes, but is not limited to, copper (Cu), and a thickness of the first metal film ranges from about 100 nm to about 500 nm, and may specifically range from 50 nm to 35 μm. In the following description, a case where the material of the first metal film is Cu is taken as an example.

In some examples, in order to increase adhesion between the first metal film to the second interlayer dielectric layer 80 (i.e., the first organic insulating layer 82), an auxiliary metal film may be formed on the second interlayer dielectric layer 80 in a manner including, but not limited to, magnetron sputtering before the metal film is deposited. A material of the auxiliary metal film includes, but is not limited to, nickel (Ni), and a thickness of the auxiliary metal film ranges from about 2 nm to about 20 nm.

Step (2) Hole-filling by electroplating: the glass substrate 10 is placed on a carrier of an electroplating machine, pressed by a powered pad, and placed in a hole-filling electroplating bath (which contains a dedicated hole-filling electrolyte), a current is applied to keep an electroplating solution to flow over the surfaces of the glass substrate 10 continuously and rapidly, and cations in the electroplating solution near the inner walls of the first connection vias 11 acquire electrons to form atoms which are deposited on the inner walls; and by using the dedicated hole-filling electrolyte with special proportion, copper may be mainly deposited in the first connection vias at a high speed (with a deposition speed ranging from 0.5 μm/min to 3 μm/min), and copper may be deposited in on the two surface of the first organic insulating layer 82, which are relatively flat, at an extremely low deposition speed (the deposition speed ranging from 0.005 μm/min to 0.05 μm/min). The copper on the inner walls of the first connection vias 11 becomes more and more thicker with time, and may even fill up the first connection vias 11, thus forming the connecting portions 213 of the induction coil 21 (that is, the formation of a spiral area of the inductor 20 is finished), and finally the glass substrate 10 is taken out and cleaned with deionized water.

Step (3) Patterning of metal: the copper layer is coated with a photoresist, exposed, developed, and subjected to copper wet etching, and the photoresist is stripped off after the copper wet etching, thus the patterning of the metal is finished, at this time the second sub-structures 212 of the induction coil 21 on a side of the second interlayer dielectric layer 80 away from the glass substrate 10, the connecting portions 213 inside the first connection vias 11, and the first lead terminal 22 and the second lead terminal 23 of the inductor 20 are formed.

Figure 13:
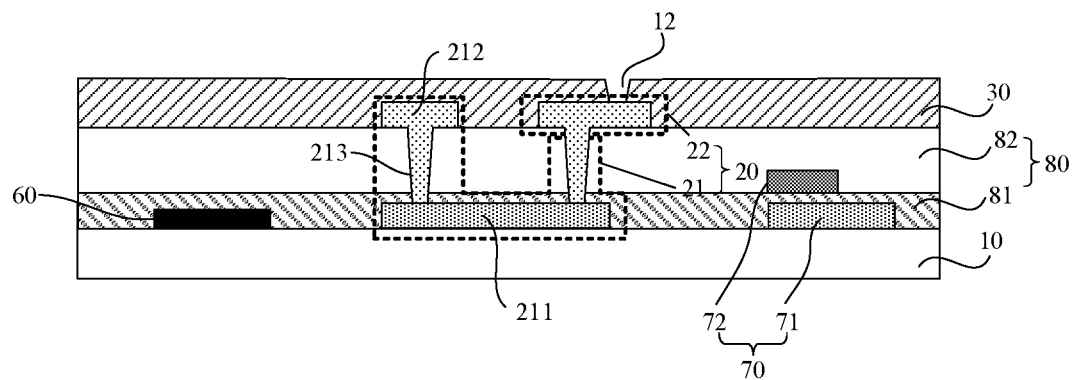
FIG. 13 is a schematic diagram showing a structure formed in step five of another method for manufacturing a substrate integrated with a passive device according to an embodiment of the present disclosure.

In step five, the first interlayer dielectric layer 30 is formed on the glass substrate 10 obtained after step four, and the second connection via 12 and the third connection via, which penetrate through the first interlayer dielectric layer 30, are formed, as shown in FIG. 13. The second connection via 12 is configured to electrically connect the first signal terminal of the induction coil 21 to the first pad 51 to be formed, and the third connection via is configured to electrically connect the second signal terminal of the induction coil 21 to the third pad 53 to be formed.

In some examples, step five may specifically include: first forming, by means of PECVD, the first interlayer dielectric layer 30 on the second surface of the glass substrate 10 on which the resistor 60, the second sub-structures of the induction coil 21 and the electrode plate of the capacitor 70 are formed, with the first interlayer dielectric layer 30 made of an inorganic insulating material. For example, the first interlayer dielectric layer 30 is an inorganic insulating layer made of silicon nitride ($SiN_x$), or an inorganic insulating layer made of silicon dioxide ($SiO_2$), or a composite layer formed by stacking several $SiN_x$ inorganic insulating layer and several $SiO_2$ inorganic insulating layer. Apparently, the first interlayer dielectric layer 30 also serves as an interlayer dielectric layer of the capacitor 70. Step four may further include coating the first interlayer dielectric layer 30 with a photoresist, performing exposure, development and dry etching processes on the photoresist, and stripping off the photoresist after the dry etching, thus obtaining the second connection via 12 and the third connection via.

In some examples, the first interlayer dielectric layer 30 has a thickness ranging from about 100 nm to about 10 μm.

Figure 14:
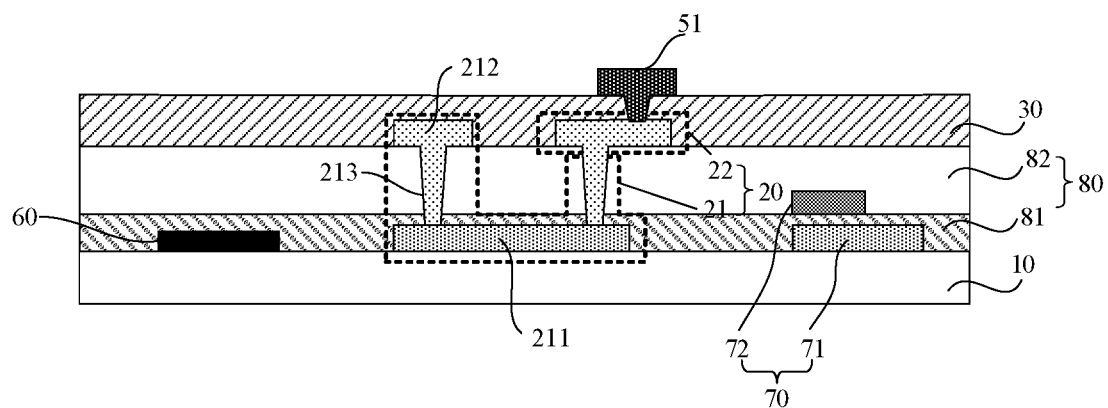
FIG. 14 is a schematic diagram showing a structure formed in step six of another method for manufacturing a substrate integrated with a passive device according to an embodiment of the present disclosure.

In step six, a pattern including the first pad 51 and the third pad 53 is formed by a patterning process on the glass substrate 10 obtained after step five, as shown in FIG. 14. The first pad 51 is electrically connected to the first signal terminal of the induction coil 21 through the second connection via 12 and a connecting portion 213 in a first connection via 11, and the third pad 53 is electrically connected to the second signal terminal of the induction coil 21 through the third connection via and a connecting portion 213 in a first connection via 11.

In some examples, step six may specifically include depositing a second metal film by means of magnetron sputtering, coating on second metal film with a photoresist, performing exposure, development and wet etching, and stripping off the photoresist after the wet etching, so as to form the pattern including the first pad 51 and the third pad 53. When the inductor 20 has the first lead terminal 22 and the second lead terminal 23, the first pad may be connected to the second end of the first one of the first sub-structures 211 through the first lead terminal 22, so as to realize that the first pad is electrically connected to the first signal terminal of the induction coil 21; and the third pad 53 may be connected to the first end of the $N^{th}$ one of the first sub-structures 211 through the second lead terminal 23, so as to realize that the third pad 53 is electrically connected to the second signal terminal of the induction coil 21.

In some examples, the second metal film has a thickness ranging from about 50 nm to about 35 μm.

Thus, the fabrication of the capacitor 70 and the inductor 20 is completed. The capacitance value of the capacitor 70 is determined according to the thickness of the first interlayer dielectric layer 30, a dielectric constant of the material of the first interlayer dielectric layer 30, and facing areas of the first electrode plate 71 and the second electrode plate 72. The inductance value of the inductor 20 is determined according to the number of turns of spirals, pitches of the spirals and diameters of the spirals together.

In addition, still with reference to FIG. 8, it should be noted that the method may further include: forming the fourth connection via, the fifth connection via, and the sixth connection via, which penetrate through the first interlayer dielectric layer 30 and the second interlayer dielectric layer 80, and forming a seventh connection via that penetrates through the first organic insulating layer 82 and the first interlayer dielectric layer 30. Correspondingly, when the first pad 51 and the third pad 53 are formed, the third pad, the fourth pad 54, the fifth pad 55, and the sixth pad 56 are formed. The first terminal of the resistor 60 is connected to the third pad through the fourth connection via, and the second terminal of the resistor 60 is connected to the fourth pad 54 through the fifth connection via. The first electrode plate 71 of the capacitor 70 is connected to the fifth pad 55 through the sixth connection via, and the second electrode plate 72 of the capacitor 70 is connected to the sixth pad 56 through the seventh connection via. A way of connecting the resistor 60/the capacitor 70 to the pads may be the same as that of connecting the inductor 20 to the pads, and thus will not be repeated here.

It should be understood that the above implementations are merely exemplary implementations adopted to illustrate the principle of the present disclosure, and the present disclosure is not limited thereto. Various modifications and improvements can be made by those of ordinary sill in the art without departing from the spirit and essence of the present disclosure, and those modifications and improvements should be considered to fall within the scope of the present disclosure.

What is claimed is:

1. A substrate integrated with a passive device, comprising:
   a dielectric layer provided with a first connection via; and
   the passive device at least comprising an inductor;
   wherein
   the inductor comprises a plurality of first sub-structures and a plurality of second sub-structures; and the a plurality of first sub-structures and the a plurality of second sub-structures are respectively disposed on two opposite sides of the dielectric layer, and two adjacent first sub-structures of the plurality of first sub-structures are short-circuited by a corresponding one of the plurality of second sub-structures through the first connection via penetrating through the dielectric layer, so as to form an induction coil of the inductor,
   wherein the induction coil comprises a first signal terminal and a second signal terminal,
   the substrate further comprises a first interlayer dielectric layer on a side of the plurality of second sub-structures away from the dielectric layer, and a first pad and a second pad on a side of the first interlayer dielectric layer away from the dielectric layer,
   the first pad is electrically connected to the first signal terminal of the induction coil through a second connection via penetrating through the first interlayer dielectric layer; and the second pad is electrically connected to the second signal terminal of the induction coil through a third connection via penetrating through the first interlayer dielectric layer.

2. The substrate of claim 1, wherein the dielectric layer comprises a glass substrate; and the first connection via penetrates through the glass substrate; and
   the glass substrate has a first surface and a second surface opposite to each other; and the plurality of first sub-structures are disposed on the first surface, and the plurality of second sub-structures are disposed on the second surface.

3. The substrate of claim 2, further comprising a first protective layer on a side of the plurality of first sub-structures away from the glass substrate.

4. The substrate of claim 2, wherein the glass substrate has a thickness ranging from 0.3 mm to 1.1 mm.

5. The substrate of claim 1, further comprising a base substrate, wherein
   the plurality of first sub-structures are disposed on a side of the dielectric layer proximal to the base substrate, and
   the plurality of second sub-structures are disposed on a side of the dielectric layer away from the base substrate.

6. The substrate of claim 5, wherein the base substrate comprises a glass substrate.

7. The substrate of claim 5, wherein the dielectric layer comprises a first inorganic insulating layer and a first organic insulating layer sequentially disposed on a side of the base substrate; and the first connection via penetrates the first inorganic insulating layer and the first organic insulating layer.

8. The substrate of claim 1, wherein a connecting portion is inside the first connection via, and two adjacent first sub-structures of the plurality of first sub-structures are short-circuited by a corresponding one of the plurality of second sub-structures through the connecting portion inside the first connection via.

9. The substrate of claim 1, wherein the passive device further comprises a resistor and/or a capacitor.

10. The substrate of claim 9, wherein, the passive device comprises the resistor, and the resistor is in a same layer as the plurality of first sub-structures or the plurality of second sub-structures.

11. The substrate of claim 9, wherein the passive device comprises the capacitor, a first electrode plate of the capacitor is in a same layer as the plurality of first sub-structures, and a second electrode plate of the capacitor is in a same layer as the plurality of second sub-structures; or
    the first electrode plate of the capacitor is in a same layer as the plurality of second sub-structures, and the second electrode plate of the capacitor is on a side of the first electrode plate away from the dielectric layer.

12. A method for manufacturing a substrate integrated with a passive device, comprising:
    providing a dielectric layer, and forming a first connection via penetrating through the dielectric layer;
    integrating the passive device on the dielectric layer; wherein the passive device at least comprises an inductor comprising a plurality of first sub-structures and a plurality of second sub-structures respectively on two opposite sides of the dielectric layer, and two adjacent first sub-structures of the plurality of first sub-structures are short-circuited by a corresponding one of the plurality of second sub-structures through the first connection via penetrating through the dielectric layer, so as to form an induction coil of the inductor, wherein the induction coil comprises a first signal terminal and a second signal terminal,
    the method further comprises:
    forming a first interlayer dielectric layer on a side of the plurality of second sub-structures away from the dielectric layer, and forming a first pad and a second pad on a side of the first interlayer dielectric layer away from the dielectric layer,
    wherein the first pad is electrically connected to the first signal terminal of the induction coil through a second connection via penetrating through the first interlayer dielectric layer; and the second pad is electrically connected to the second signal terminal of the induction coil through a third connection via penetrating through the first interlayer dielectric layer.

13. The method of claim 12, wherein
    the dielectric layer comprises a glass substrate having a first surface and a second surface opposite to each other; and
    integrating the passive device on the dielectric layer comprises:
    forming the first connection via penetrating through the glass substrate by means of laser drilling; and
    forming the plurality of first sub-structures of the inductor on the first surface of the glass substrate, and forming the plurality of second sub-structures of the inductor on the second surface of the glass substrate, such that two adjacent first sub-structures of the plurality of first sub-structures are short-circuited by a corresponding one of the plurality of second sub-structures through the first connection via.

14. The method of claim 13, wherein forming the plurality of first sub-structures of the inductor on the first surface of the glass substrate and forming the plurality of second sub-structures of the inductor on the second surface of the glass substrate comprises:
    forming electroplating seed layers on the first surface and the second surface of the glass substrate and on an inner wall of the first connection via, respectively; forming metal layers on the first surface and the second surface by an electroplating process respectively, and forming a connecting portion on the inner wall of the first connection via by the electroplating process; and respectively patterning the metal layers on the first surface and the second surface to form the plurality of first sub-structures and the plurality of second sub-structures, such that two adjacent first sub-structures of the plurality of first sub-structures are short-circuited by a corresponding one of the plurality of second sub-structures through the connecting portion inside the first connection via.

15. The method of claim 14, wherein forming the electroplating seed layers on the first surface and the second surface of the glass substrate and on the inner wall of the first connection via respectively comprises:

first forming auxiliary metal films on the first surface and the second surface of the glass substrate and on the inner wall of the first connection via respectively, and then forming first metal films on the auxiliary metal films to form the electroplating seed layers.

16. The method of claim 12, wherein the substrate comprises a base substrate; and integrating the passive device on the dielectric layer comprises:

forming a pattern comprising the plurality of first sub-structures of the inductor on the base substrate by a patterning process;

forming the dielectric layer, and forming the first connection via penetrating through the dielectric layer; and forming the plurality of second sub-structures of the inductor, such that two adjacent first sub-structures of the plurality of first sub-structures are short-circuited by one of the plurality of second sub-structures through the first connection via.

17. The method of claim 16, wherein the dielectric layer comprises a first inorganic insulating layer and a first organic insulating layer sequentially on a side of the base substrate; and forming the dielectric layer and forming the first connection via penetrating through the dielectric layer comprises:

forming the first inorganic insulating layer, and forming a first sub-via penetrating through the first inorganic insulating layer by a patterning process; and forming the first organic insulating layer, and forming a second sub-via penetrating through the first organic insulating layer by a patterning process, such that an orthographic projection of the second sub-via on the base substrate at least partially overlaps an orthographic projection of the first sub-via on the base substrate, so as to form the first connection via.

18. The method of claim 16, wherein forming the plurality of second sub-structures of the inductor comprises:

forming electroplating seed layers on a surface of the dielectric layer away from the base substrate and on an inner wall of the first connection via; forming a metal layer on the surface of the dielectric layer away from the base substrate by an electroplating process, and forming a connecting portion on the inner wall of the first connection via by the electroplating process; and patterning the metal layer to form the plurality of second sub-structures, such that two adjacent first sub-structures of the plurality of first sub-structures are short-circuited by a corresponding one of the plurality of second sub-structures through the connecting portion inside the first connection via.

* * * * *